(12) United States Patent
Yu et al.

(10) Patent No.: US 12,342,656 B1
(45) Date of Patent: Jun. 24, 2025

(54) SOLAR CELL AND SOLAR CELL MODULE

(71) Applicants: SHANGHAI JINKO GREEN ENERGY ENTERPRISE MANAGEMENT CO., LTD., Shanghai (CN); ZHEJIANG JINKO SOLAR CO., LTD., Zhejiang (CN)

(72) Inventors: Ding Yu, Zhejiang (CN); Wenqi Li, Zhejiang (CN); Shijie Zhao, Zhejiang (CN); Xiaowen Zhang, Zhejiang (CN); Jialei Chai, Zhejiang (CN); Xinyu Zhang, Zhejiang (CN); Hao Jin, Zhejiang (CN); Jie Yang, Zhejiang (CN)

(73) Assignees: Shanghai Jinko Green Energy Enterprise Management Co., LTD., Shanghai (CN); Zhejiang Jinko Solar Co., Ltd., Haining (CN)

( * ) Notice: Subject to any disclaimer, the term of this patent is extended or adjusted under 35 U.S.C. 154(b) by 0 days.

(21) Appl. No.: 18/434,576

(22) Filed: Feb. 6, 2024

Related U.S. Application Data

(63) Continuation of application No. 17/483,746, filed on Sep. 23, 2021, now Pat. No. 12,009,446.

(30) Foreign Application Priority Data

Aug. 26, 2021 (CN) .......................... 202110989144.4

(51) Int. Cl.
*H10F 77/30* (2025.01)
*H10F 19/80* (2025.01)
(Continued)

(52) U.S. Cl.
CPC ........... *H10F 77/315* (2025.01); *H10F 19/80* (2025.01); *H10F 77/122* (2025.01); *H10F 77/707* (2025.01)

(58) Field of Classification Search
CPC ........... H01L 31/1868; H01L 31/02167; H01L 31/02168; H01L 31/02366; H01L 31/028;
(Continued)

(56) References Cited

U.S. PATENT DOCUMENTS

2008/0202577 A1* 8/2008 Hieslmair ........... H01L 31/0504
136/258
2010/0059114 A1 3/2010 Park et al.
(Continued)

FOREIGN PATENT DOCUMENTS

AU 2021240193 B1 12/2022
AU 2021235314 B1 3/2023
(Continued)

OTHER PUBLICATIONS

Machine translation of CN-104900722-A, Zhang Y. (Year: 2015).*
(Continued)

*Primary Examiner* — Mayla Gonzalez Ramos
(74) *Attorney, Agent, or Firm* — USCH Law, PC

(57) ABSTRACT

A solar cell, a method for producing a solar cell and a solar cell module are provided. The solar cell includes: a substrate having a front surface and a rear surface opposite to the front surface; a first passivation layer, a second passivation layer and a third passivation layer sequentially formed on the front surface and in a direction away from the front surface; wherein the first passivation layer includes a dielectric material; the second passivation layer includes a first silicon nitride $Si_mN_n$ material, and a ratio of n/m is 0.5~1; the third passivation layer includes a silicon oxynitride $SiO_iN_j$ material, and a ratio of j/i is 0.1~0.6; and a tunneling oxide layer and a doped conductive layer sequentially formed on the rear surface and in a direction away from the rear surface, wherein the doped conductive layer and the substrate have a doping element of a same conductivity type.

17 Claims, 4 Drawing Sheets

(51) Int. Cl.
*H10F 77/122* (2025.01)
*H10F 77/70* (2025.01)

(58) Field of Classification Search
CPC ... H01L 31/048; H10F 77/122; H10F 77/315; H10F 77/707; H10F 19/80
See application file for complete search history.

(56) References Cited

U.S. PATENT DOCUMENTS

| | | | |
|---|---|---|---|
| 2010/0258177 | A1 | 10/2010 | Ko et al. |
| 2013/0160839 | A1 | 6/2013 | Cheong et al. |
| 2013/0247972 | A1 | 9/2013 | Mungekar et al. |
| 2013/0330936 | A1* | 12/2013 | Lachaud ............... H01L 21/022 438/787 |
| 2015/0214397 | A1 | 7/2015 | Chung et al. |
| 2015/0380574 | A1 | 12/2015 | Johnson et al. |
| 2017/0200850 | A1 | 7/2017 | Lee et al. |
| 2017/0222067 | A1 | 8/2017 | Seutter et al. |
| 2019/0027619 | A1* | 1/2019 | Kai ................... H01L 31/02167 |
| 2021/0217907 | A1* | 7/2021 | Chen .................. H01L 31/068 |

FOREIGN PATENT DOCUMENTS

| | | | | |
|---|---|---|---|---|
| CN | 101866956 | A | | 10/2010 |
| CN | 102290473 | A | | 12/2011 |
| CN | 102487103 | A | | 6/2012 |
| CN | 104900722 | A | * | 9/2015 |
| CN | 106129133 | A | | 11/2016 |
| CN | 107978644 | A | | 5/2018 |
| CN | 207818594 | U | | 9/2018 |
| CN | 109065639 | A | | 12/2018 |
| CN | 109087956 | A | * | 12/2018 ....... H01L 31/02167 |
| CN | 109728104 | A | | 5/2019 |
| CN | 208923157 | U | | 5/2019 |
| CN | 209471975 | U | | 10/2019 |
| CN | 110707159 | A | | 1/2020 |
| CN | 110735130 | A | * | 1/2020 ........... C23C 16/308 |
| CN | 210778614 | U | | 6/2020 |
| CN | 111668317 | A | | 9/2020 |
| CN | 111668318 | A | | 9/2020 |
| CN | 111933752 | A | | 11/2020 |
| CN | 112164728 | A | | 1/2021 |
| CN | 112201701 | A | | 1/2021 |
| CN | 112349816 | A | | 2/2021 |
| CN | 112447863 | A | | 3/2021 |
| CN | 112531035 | A | | 3/2021 |
| CN | 112635592 | A | | 4/2021 |
| CN | 213071156 | U | | 4/2021 |
| CN | 113299772 | A | | 8/2021 |
| JP | 5019397 | B2 | | 9/2012 |
| JP | 2013149815 | A | | 8/2013 |
| JP | 2014045187 | A | | 3/2014 |
| JP | 2015122435 | A | | 7/2015 |
| JP | 2016018998 | A | | 2/2016 |
| JP | 2017526155 | A | | 9/2017 |
| JP | 6916972 | B1 | | 8/2021 |
| KR | 20200061479 | A | | 6/2020 |

OTHER PUBLICATIONS

Anishkumar Soman et al., "Broad range refractive index engineering of SixNy and SiOxNy thin films and exploring their potential applications in crystalline silicon solar cells," Materials Chemistry and Physics, vol. 197, 2017,11 pgs. (Year: 2017).*
Machine translation of CN-109087956-A, Chen J. (Year: 2018).*
Machine translation of CN-110735130-A, Guo Y. (Year: 2020).*
Shanghai Jinko Green Energy Enterprise Management Co., Ltd., et al., JP First Office Action with English translation, JP 2023-082684, Jun. 27, 2024, 10 pgs.
Shanghai Jinko Green Energy Enterprise Management Co., Ltd., et al., Examination report No. 1 for standard patent application, AU 2023203717, Mar. 27, 2024, 12 pgs.
Soman A., et al., "Broad range refractive index engineering of SixNy and SiOxNy thin films and exploring their potential applications in crystalline silicon solar cells", Materials Chemistry and Physics, vol. 197, Aug. 15, 2017, 11 pgs.
Dupuis J., et al., "Impact of PECVD SiON stoichimetry and post-annealing on the silicon surface passivation", HAL, open science, Dec. 10, 2007, 13 pgs. Retrived from the internet: http://hal.archives-ouvsetes.fr/hal-00951444/document.
Shanghai Jinko Green Energy Enterprise Management Co., Ltd., et al., Non-Final Rejection, U.S. Appl. No. 17/483,746, Oct. 22, 2022, 18 pgs.
Shanghai Jinko Green Energy Enterprise Management Co., Ltd., et al., Extended European Search Report, EP 21198086.7, Nov. 23, 2021, 6 pgs.
Shanghai Jinko Green Energy Enterprise Management Co., Ltd et al., AU First Office Action, AU 2021235314, Sep. 7, 2022, 5 pgs.
Shanghai Jinko Green Energy Enterprise Management Co., Ltd et al., AU Second Office Action, AU 2021235314, Nov. 28, 2022, 8 pgs.
Shanghai Jinko Green Energy Enterprise Management Co., Ltd et al., JP First Office Action with English translation, JP 2021-154789, Jan. 5, 2022, 6 pgs.
Shanghai Jinko Green Energy Enterprise Management Co., Ltd et al., CN First Office Action with English translation, CN 2021109891444, Jan. 18, 2023, 39 pgs.

* cited by examiner

SOLAR CELL AND SOLAR CELL MODULE

CROSS-REFERENCE TO RELATED APPLICATION

The present application is a continuation of U.S. patent application Ser. No. 17/483,746, entitled "SOLAR CELL AND SOLAR CELL MODULE," filed Sep. 23, 2021, which claims priority to Chinese Patent Application No. 202110989144.4, filed on Aug. 26, 2021, each of which is incorporated by reference herein in its entirety.

TECHNIC FIELD

Embodiments of the present disclosure relate to the solar cell technology, in particular to a solar cell, a method for producing a solar cell and a solar cell module.

BACKGROUND

With the continuous development of solar cell technology, light absorption efficiency of a solar cell has become an important factor that restricts the further improvement of conversion efficiency of the solar cell. The light absorption efficiency of the solar cell is related to parameters of a passivation structure of the solar cell, which include but are not limited to type of passivation layer(s), material composition(s) and thickness of the passivation layer(s). Therefore, it is desired to optimize the parameters of the passivation structure to improve the conversion efficiency of the solar cell.

SUMMARY

As one aspect, some embodiments of the present disclosure provide a solar cell, including: a substrate having a front surface and a rear surface opposite to the front surface; a first passivation layer, a second passivation layer and a third passivation layer sequentially formed on the front surface and in a direction away from the front surface; wherein the first passivation layer includes a dielectric material; the second passivation layer includes a first silicon nitride $Si_mN_n$ material, and a ratio of n/m is 0.5~1; the third passivation layer includes a silicon oxynitride $SiO_iN_j$ material, and a ratio of j/i is 0.1~0.6; and a tunneling oxide layer and a doped conductive layer sequentially formed on the rear surface and in a direction away from the rear surface, wherein the doped conductive layer and the substrate have a doping element of a same conductivity type.

In some examples, the dielectric material includes at least one of aluminum oxide, titanium oxide, gallium oxide and hafnium oxide.

In some examples, the dielectric material is an aluminum oxide $Al_xO_y$ material, and a ratio of y/x is 1.1~1.5.

In some examples, the first passivation layer has a thickness of 3 nm~10 nm in a direction perpendicular to the front surface.

In some examples, the second passivation layer has a thickness of 40 nm~60 nm in a direction perpendicular to the front surface.

In some examples, the third passivation layer has a thickness of 20 nm~50 nm in a direction perpendicular to the front surface.

In some examples, a second refractive index of the second passivation layer is greater than both a first refractive index of the first passivation layer and a third refractive index of the third passivation layer.

In some examples, the first passivation layer has a refractive index of 1.6~1.7, the second passivation layer has a refractive index of 1.9~2.2, and the third passivation layer has a refractive index of 1.45~1.8.

In some examples, the solar cell further includes a fourth passivation layer formed on a side of the doped conductive layer facing away from the substrate; the fourth passivation layer includes a second silicon nitride $Si_aN_b$ material, and a ratio of a/b is 3.5~6.8.

In some examples, the fourth passivation layer has a refractive index of 2.04~2.2, and the fourth passivation layer has a thickness of 60 nm~100 nm in a direction perpendicular to the rear surface.

In some examples, the first passivation layer further includes a silicon oxide material; and the silicon oxide material is embedded between the substrate and the dielectric material.

In some examples, the substrate is an N-type semiconductor substrate; the doped conductive layer is at least one of an N-type doped polycrystalline silicon layer, an N-type doped microcrystalline silicon layer and an N-type doped amorphous silicon layer.

As a second aspect, some embodiments of the present disclosure further provide a solar cell module, includes: at least one solar cell string each formed by connecting a plurality of the solar cells according to any one of the above solar cells; a packaging film configured to cover a surface of each of the at least one solar cell string; and a cover plate configured to cover a surface of the packaging film away from the at least one solar cell string.

As a third aspect, some embodiments of the present disclosure further provide a method for producing a solar cell, includes: providing a substrate having a front surface and a rear surface opposite to the front surface; forming a first passivation layer, a second passivation layer and a third passivation layer sequentially on the front surface and in a direction away from the front surface; wherein the first passivation layer includes a dielectric material; the second passivation layer includes a first silicon nitride $Si_mN_n$ material, and a ratio of n/m is 0.5~1; the third passivation layer includes a silicon oxynitride $SiO_iN_j$ material, and a ratio of j/i is 0.1~0.6; and forming a tunneling oxide layer and a doped conductive layer sequentially on the rear surface and in a direction away from the rear surface, wherein the doped conductive layer and the substrate have a doping element of a same conductivity type.

In some examples, the dielectric material is an aluminum oxide $Al_xO_y$ material; the first passivation layer is formed by an atomic layer deposition process; precursors of the atomic layer deposition process include trimethyl aluminum and water; and a deposition temperature of the atomic layer deposition process is 150° C.~250° C.

In some examples, after the first passivation layer is formed, the method further includes: performing an annealing process on the first passivation layer, wherein a process temperature of the annealing process is 450° C.~550° C., and a process duration of the annealing process is greater than or equal to 10 minutes.

In some examples, the second passivation layer is formed by a first plasma-enhanced chemical vapor deposition process, wherein precursors of the first plasma-enhanced chemical vapor deposition process include silane and ammonia gas; a flow ratio of the ammonia gas to the silane is 4~15; and a pulse power per unit area of the first plasma-enhanced chemical vapor deposition process is 30~40 $mW/cm^2$.

In some examples, the third passivation layer is formed by a second plasma-enhanced chemical vapor deposition process, wherein precursors of the second plasma-enhanced chemical vapor deposition process include silane, nitrous oxide and ammonia gas; a flow ratio of the silane to the nitrous oxide is not less than 1/10; and a pulse power per unit area of the second plasma-enhanced chemical vapor deposition process is 25~40 mW/cm².

BRIEF DESCRIPTION OF THE DRAWINGS

One or more embodiments are described as examples with reference to the corresponding figures in the accompanying drawings. The figures in the accompanying drawings do not constitute a proportion limitation unless otherwise stated.

DETAILED DESCRIPTION OF THE EMBODIMENTS

In order to make the objectives, technical solutions and advantages of the embodiments of the present disclosure clearer, embodiments of the present disclosure will be described in detail below with reference to the accompanying drawings. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
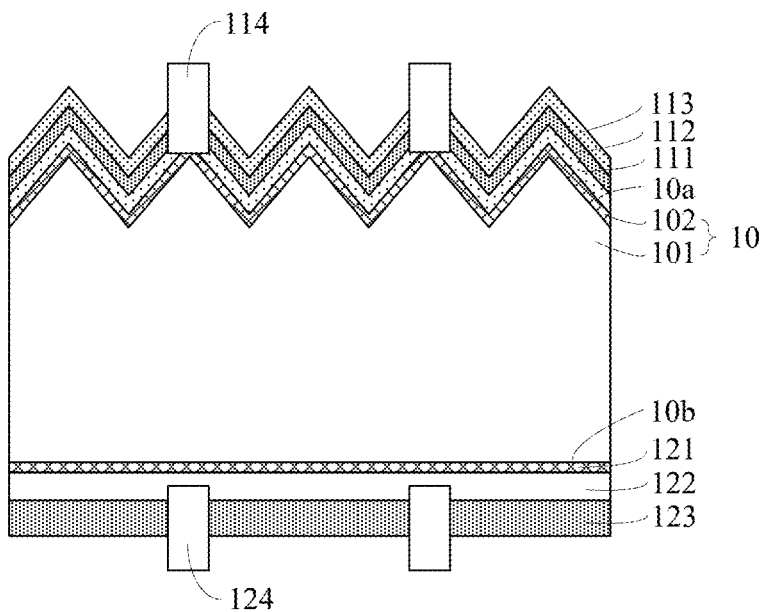
FIG. 1 shows a schematic diagram of a cross-sectional structure of a solar cell according to some embodiments of the present disclosure.
Figure 2:
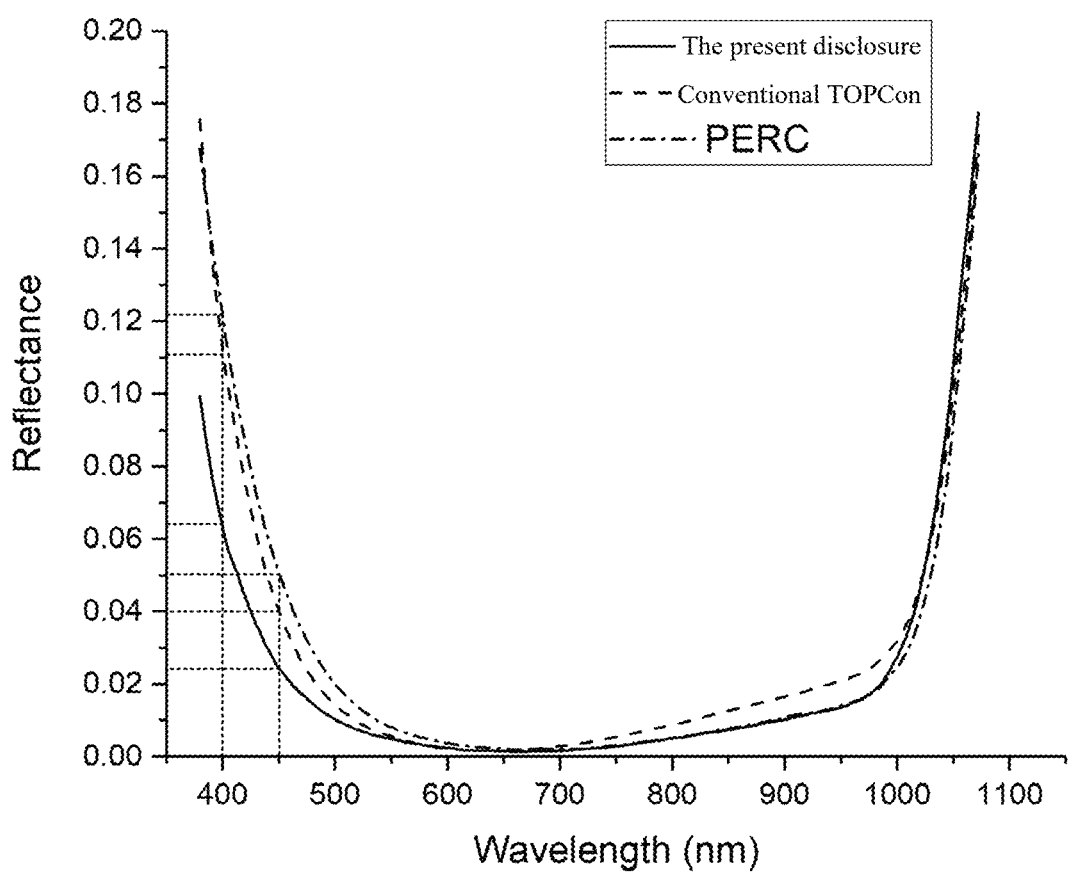
FIG. 2 shows a wavelength-reflectivity comparison diagram according to some embodiments of the present disclosure.
Figure 3:
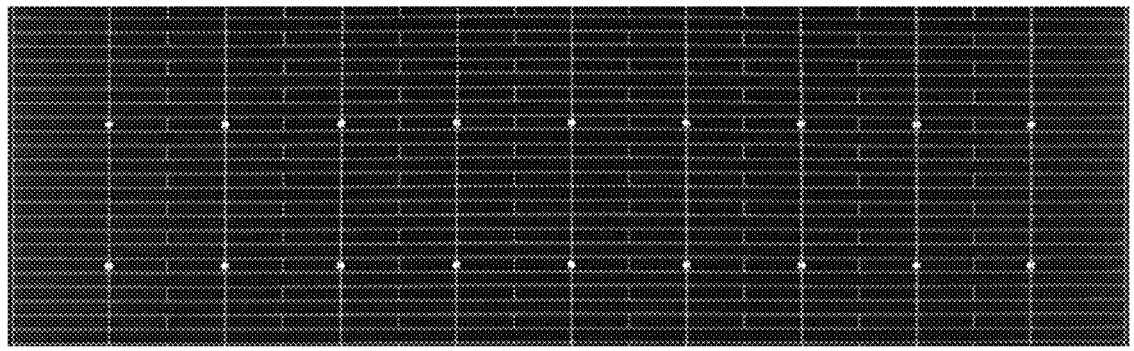
FIG. 3 shows a schematic diagram of a surface of the solar cell according to some embodiments of the present disclosure.

Some embodiments of the present disclosure provide a solar cell, a method for producing a solar cell and a solar cell module. The solar cell provided by embodiments of the present disclosure will be described in detail below with reference to the accompanying drawings. FIG. 1 shows a schematic diagram of a cross-sectional structure of a solar cell according to some embodiments of the present disclosure. FIG. 2 shows a wavelength-reflectivity comparison diagram according to some embodiments of the present disclosure. FIG. 3 shows a schematic diagram of a surface of the solar cell according to some embodiments of the present disclosure.

As shown in FIG. 1, the solar cell includes: a substrate 10 having a front surface 10a and a rear surface 10b opposite to the front surface 10a; a first passivation layer 111, a second passivation layer 112 and a third passivation layer 113 sequentially formed on the front surface 10a and in a direction away from the front surface 10a; and a tunneling oxide layer 121 and a doped conductive layer 122 sequentially formed on the rear surface 10b and in a direction away from the rear surface 10b. The first passivation layer 111 includes a dielectric material. The second passivation layer 112 includes a first silicon nitride $Si_mN_n$ material, and a ratio of n/m is 0.5~1. The third passivation layer 113 includes a silicon oxynitride $SiO_iN_j$ material, and a ratio of j/i is 0.1~0.6. The doped conductive layer 122 and the substrate 10 have a doping element of a same conductivity type.

It can be understood that the y/x, n/m and j/i refer to atomic ratios.

In some examples, the atomic ratio in each film layer may be obtained by an X-ray energy dispersive spectroscopy (EDS) process or an electron energy loss spectroscopy (EELS) process. In some examples, the second passivation layer 112 is a silicon-rich layer. That is, the proportion of silicon atoms in the first silicon nitride $Si_mN_n$ material is greater than the proportion of nitrogen atoms in the first silicon nitride $Si_mN_n$ material. The third passivation layer 113 may also be a silicon-rich layer, that is, the proportion of silicon atoms in the silicon oxynitride $SiO_iN_j$ material is greater than both the proportion of nitrogen atoms and the proportion of oxygen atoms in the silicon oxynitride $SiO_iN_j$ material.

Herein, the third passivation layer 113 including the silicon oxynitride $SiO_iN_j$ material is formed on a side of the second passivation layer 112 facing away from the substrate 10, which is beneficial to make the solar cell have a relatively good absorption efficiency for short-wave light. Moreover, an atomic ratio of the silicon oxynitride $SiO_iN_j$ material is defined, which is beneficial to make the third passivation layer 113 have a relatively high refractive index, so that external light can enter the substrate 10 at a relative smaller incident angle.

In addition, an atomic ratio of the first silicon nitride $Si_mN_n$ material of the second passivation layer 112 is defined, so that the second passivation layer 112 may have a higher refractive index than the third passivation layer 113, which is beneficial to reduce internal reflection and emission of light. Besides, the second passivation layer 112 may have a relatively weak electropositivity, which is beneficial to avoid an effect of the second passivation layer 112 on a field passivation effect of the first passivation layer 111 and a photoelectric effect of the substrate 10. Further, the second passivation layer 112 may have an appropriate amount of hydrogen ions, which may not only effectively saturate dangling bonds of the front surface 10a through migration, but also inhibit recombination with carriers, thereby ensuring that the carriers can effectively converge to a corresponding electrode of the solar cell.

The solar cell shown in FIG. 1 will be described in more detail below with reference to the accompanying drawings.

In some examples, the substrate 10 is a silicon-based material, such as at least one of monocrystalline silicon, polycrystalline silicon, amorphous silicon and microcrystalline silicon. In other examples, the material of the substrate may be a carbon simple substance, an organic material or a multi-component compound, and the multi-component compound may include but is not limited to: perovskite, gallium arsenide, cadmium telluride, copper indium selenium, etc. In addition, the front surface 10a is a light-receiving surface, and the rear surface 10b is a back surface opposite to the light-receiving surface. The front surface 10a may be set as a pyramid textured surface, so as to reduce light reflection of the front surface 10a, increase the light absorption and utilization rate, and improve the conversion efficiency of the solar cell. In some examples, the rear surface 10b may be set as a non-pyramid textured surface, such as a stacked and stepped morphology, to ensure that the tunneling oxide layer covering the rear surface 10b has relatively high density and uniformity, and accordingly the tunneling oxide layer can have a good passivation effect on the rear surface 10b.

The substrate 10 is an N-type semiconductor substrate. Herein, the substrate 10 includes a base 101 and an emitter 102. The base 101 includes an N-type doping element (such as phosphorus, arsenic, antimony, etc.), and the emitter 102 includes a P-type doping element. The emitter 102 and the base 101 form a PN junction. In some examples, the first passivation layer 111 covers the emitter 102. The emitter 102 may be formed by doping and diffusing P-type ions (e.g., boron ions) at a surface layer of the base 101, and the doped layer of the base 101 may be referred as the emitter 102. The doped conductive layer 122 and the substrate 10 have a doping element of a same conductivity type refers to that a doping ion type of the doped conductive layer 122 is the same as a doping ion type of a main body of the substrate 10, that is, the doping ion type of the doping conductive layer 122 is the same as a doping ion type of the base 101.

The material of the first passivation layer 111 may be an interface passivation material or a field passivation material depending on a main passivation effect (i.e., an interface passivation effect or a field passivation effect) to be achieved by the first passivation layer 111. The interface passivation material includes at least one of silicon oxide and silicon oxynitride. The field passivation material includes at least one of aluminum oxide, titanium oxide, gallium oxide and hafnium oxide. Hereinafter, the material of the first passivation layer 111 is the field passivation material, particularly an aluminum oxide $Al_xO_y$ material is taken as an example.

With regard to material characteristics of the first passivation layer 111, from the perspective of enhancing the field passivation effect of the first passivation layer 111 and achieving a selective transmission of the carriers, it is required to set the first passivation layer 111 to have a relatively strong electronegativity; from the perspective of inhibiting the migration and permeation of external positive ions toward the substrate 10, it is required to set the first passivation layer 111 to have a relatively weak electronegativity; from the perspective of reducing a stress between the first passivation layer 111 and an adjacent film layer, it is required to set the first passivation layer 111 to have a relatively low hardness; in addition, an absorption effect of the first passivation layer 111 on the short-wave light needs to be considered, so as to improve the absorption efficiency of the solar cell for the short-wave light. Based on the above considerations, the ratio of y/x of the aluminum oxide $Al_xO_y$ material of the first passivation layer 111 may be set to 1.1~1.5, for example, 1.2, 1.3 or 1.4, and optionally, the ratio of y/x is greater than or equal to 1.1 and less than 1.5.

With regard to a thickness of the first passivation layer 111 in a direction perpendicular to the front surface 10a, it can be understood that the thicker the thickness of the first passivation layer 111, the stronger the field passivation effect. Moreover, due to the great difference in material characteristics between the aluminum oxide and silicon, the thicker the first passivation layer 111, the greater the stress exerted by the first passivation layer 111 on the substrate 10. Further, since any film layer may have a barrier effect per se, the thicker the thickness of the first passivation layer 111, the less likely it is for the hydrogen ions in the second passivation layer 112 to pass through the first passivation layer 111 to saturate the dangling bonds of the front surface 10a. Based on the above considerations, the thickness of the first passivation layer 111 may be set to 3 nm~10 nm, for example, 5 nm, 7 nm, or 9 nm.

In some examples, the first passivation layer 111 further includes a silicon oxide material, which covers the front surface 10a. In other words, the silicon oxide material is embedded between the N-type substrate 10 and the dielectric material, and the dielectric material includes the aluminum oxide $Al_xO_y$ material. The silicon oxide material may be formed by a natural oxidation process or a thermal oxygen process, to passivate the front surface. In the direction perpendicular to the front surface 10a, a thickness of a film layer including the silicon oxide material may be set to 0.5~2 nm, for example, 0.8 nm, 1.1 nm, 1.4 nm or 1.7 nm. If the thickness of the film layer is too thick, the carriers may be unable to pass through the film layer due to the tunneling effect; and if the thickness of the film layer is too thin, the passivation effect thereof is relatively poor.

In some examples, when the atomic ratio of the first silicon nitride $Si_mN_n$ material of the second passivation layer 112 is set, a refractive index range of the second passivation layer 112 is also roughly determined (the refractive index is also affected by other impurity elements in the second passivation layer 112). In order to ensure that the light incident through the second passivation layer 112 is closer to the center of the substrate 10, and to inhibit the emission of the light, the thickness of the second passivation layer 112 in the direction perpendicular to the front surface 10a may be set to 40 nm~60 nm, for example, 45 nm, 50 nm, or 55 nm. If the thickness of the second passivation layer 112 is too thin, the refraction effect of the second passivation layer 112 on light is poor, and the incident light may be emitted out of other passivation layers or emitted out of the substrate 10 before being absorbed by the substrate 10, which is not conducive to improving the incident efficiency of the light on the solar cell. In addition, since the second passivation layer 112 has a relatively weak electropositivity, the hydrogen ions in the second passivation layer 112 may be unable to saturate the dangling bonds in the front surface 10a, which needs to be supplemented by the hydrogen ions in the third passivation layer 113. Therefore, if the second passivation layer 112 is too thick, the transmission of the hydrogen ions may be blocked, resulting in more interface defects in the front surface 10a, which is not conducive to inhibiting the carrier recombination in the front surface 10a and reducing a contact resistance of the front surface 10a.

In addition, it can be understood that a thickness selection of the second passivation layer 112 is also affected by the atomic ratio of material of the second passivation layer 112. The two factors, i.e., the thickness and the atomic ratio, are coordinated, so as to enable the second passivation layer 112 to mainly absorb light in a specific wavelength band, for example, mainly absorb a long-wave light. Further, the thickness of the second passivation layer 112 is also limited by a overall thickness requirement of the solar cell. If the overall thickness of the solar cell is too thin, the solar cell is easy to damage under the influence of an external stress; and if the overall thickness of the solar cell is too thick, it is not conducive to overall packaging and the process cost is relatively high.

In some examples, in order to make the solar cell have better absorption efficiency for both the long-wave light and the short-wave light, the second passivation layer 112 is mainly used to absorb the long-wave light and the third passivation layer 113 is mainly used to absorb the short-wave light. Moreover, since a refractive index of the silicon oxynitride material of the third passivation layer 11 which mainly absorbs the short-wave light is relatively low, in order to make the solar cell have a relatively high refractive index for lights in different wave bands, the refractive index of the second passivation layer 112 may be set to be greater than that of the third passivation layer 113, so as to improve the absorption efficiency of the solar cell for the light.

In some examples, when the atomic ratio of the silicon oxynitride $SiO_iN_j$ material of the third passivation layer 113 is set, in order to make the solar cell have a relatively high absorption efficiency for the short-wave light and enable the hydrogen ions in the third passivation layer 113 to supplement the hydrogen ions in the second passivation layer 112, the thickness of the third passivation layer 113 in a direction perpendicular to the front surface 10a may be set to be 20 nm~50 nm, for example, 25 nm, 30 nm, 35 nm, 40 nm or 45 nm. In some cases, the existing solar cells are usually light blue, which is mainly due to the high reflectivity of the short-wave light (such as an ultraviolet light wave band). However, in the case that the thickness of the third passivation layer 113 is within a specific range (e.g., 20 nm~50 nm) to mainly absorb the short-wave light, the solar cell may be dark blue or even black. The solar cell module formed by packaging the solar cells is black, which can have high power generation efficiency and prospect of being suitable for multi-application scenarios (e.g., BIPV, building integrated solar cell).

In some examples, the solar cell may be light blue if the thickness of the third passivation layer 113 is less than 20 nm; and the solar cell may be green if the thickness of the third passivation layer 113 is greater than 50 nm.

It should be noted that both the second passivation layer 112 and the third passivation layer 113 may have a multi-layer structure, and the refractive indices of different sub-layers in the multi-layer structure gradually decrease in the direction away from the front surface 10a of the substrate 10. In this way, it is conducive to reducing an internal reflection and emission caused by an excessive difference in the refractive indices of adjacent film layers. The adjacent film layers may include the film layers in the solar cell, or may include a packaging film and a cover plate in a solar cell module.

In some examples, a second refractive index of the second passivation layer 112 is greater than both a first refractive index of the first passivation layer 111 and a third refractive index of the third passivation layer 113. Herein, the second refractive index is greater than the third refractive index, which is beneficial to reducing reflection and emission of light incident through the third passivation layer 113. Further, in some examples, the first refractive index is greater than the third refractive index, which is beneficial to further reduce the reflection and emission of the light incident through the third passivation layer 113 and improve the light absorption efficiency of the solar cell. It can be understood that when the above-mentioned film layer includes a plurality of sub-film layers, the refractive index of the film layer is an average refractive index of the plurality of sub-film layers.

With regard to the third passivation layer 113, from the perspective of reducing the incident angle of the external light, it is required to set the third passivation layer 113 to have a relatively high refractive index; from the perspective of suppressing the internal reflection and the emission, it is required to set the third passivation layer 113 to have a relatively small refractive index, and make a difference between the refractive index of the third passivation layer 113 and the refractive index of the second passivation layer 112 be relatively small; from the perspective of mainly absorbing the short-wave light, it is required to set an oxygen atomic ratio of the third passivation layer 113 to be relatively large, but the refractive index of the third passivation layer 113 gradually decreases with the increase of the oxygen atomic ratio of the third passivation layer 113. In order to make the solar cell have relatively high absorption efficiency for the short-wave light, the atomic ratio j/i of the third passivation layer 113 including the silicon oxynitride $SiO_iN_j$ material may be set to 0.43~0.46, for example, 0.44 or 0.45, and the refractive index of the third passivation layer 113 may be set to 1.45~1.8, for example, 1.55, 1.6, 1.65, 1.7 or 1.75.

In addition, the atomic ratio n/m of the second passivation layer 112 including the first silicon nitride $Si_mN_n$ material may be set to 0.56~0.7, for example, 0.60, 0.64 or 0.68, and the refractive index of the second passivation layer 112 may be set to 1.9~2.2, for example, 2.0, 2.05 or 2.1. The refractive index of the first passivation layer 111 may be set to 1.6~1.7, for example, 1.63, 1.65 or 1.68.

As shown in FIG. 2, in the short-wave (e.g., the ultraviolet light wave band) range, the solar cell provided by the embodiments of the present disclosure has a lower reflectivity than a conventional TOPCON solar cell (N-type TOPCON solar cell) and a PERC solar cell (P-type PERC solar cell). The conventional TOPCON solar cell usually uses an aluminum oxide/silicon nitride stacked layer as a front passivation layer, and the conventional PERC solar cell usually uses a silicon nitride layer as the front passivation layer. Taking light at a wavelength of 400 nm as an example, a reflectivity of the conventional PERC solar cell is about 12.2%, a reflectivity of the conventional TOPCON solar cell is about 11.1%, and a reflectivity of the solar cell provided by the embodiments of the present disclosure is about 6.5%, which is reduced by nearly half. Taking light at a wavelength of 450 nm as an example, the reflectivity of the conventional PERC solar cell is about 5%, the reflectivity of the conventional TOPCON solar cell is about 4%, and the reflectivity of the solar cell provided by the embodiments of the present disclosure is about 2.4%, which is also reduced by nearly half. Due to the relatively low reflectivity of light in the short-wave range, compared with the conventional solar cell or a conventional solar cell module, the solar cell provided in the embodiments may be dark blue or even black, thus facilitate forming a black solar cell module. As shown in FIG. 3, the solar cell based on the structure shown in FIG. 1 is dark blue and near black.

The solar cell provided by the embodiments of the present disclosure also has a greatly lower average reflectivity for the light at wavelength range of 380 nm~1050 nm. Generally, the average reflectivity of the conventional PERC solar cell and the conventional TOPCON solar cell for the light at wavelength range of 380 nm~1050 nm is 2.1-2.3%. For example, the average reflectivity of the conventional PERC solar cell is about 2.160%, and the average reflectivity of the conventional TOPCON solar cell is about 2.237%, while the average reflectivity of the solar cell provided by the embodiments of the present disclosure is 1.4%~1.7%, e.g., about 1.552%, which is reduced by nearly ⅓. Further, the average reflectivity for the light at the wavelength range of 600 nm~800 nm of the solar cell provided by the embodiments of the present disclosure is also less than 1%. Accordingly, in the case that the passivation stacked structure (the first passivation layer 111, the second passivation layer 112 and the third passivation layer 113) is applied to a TOPCON solar cell, a short-circuit current of the TOPCON solar cell may be increased by more than 30 mA.

In some examples, a first intermediate layer may be provided between the first passivation layer 111 and the second passivation layer 112. In this case, the first passivation layer 111 serves as a field effect passivation layer, the second passivation layer 112 serves as a chemical effect passivation layer, and the first intermediate layer may be used to optimize an electrical conductivity or light absorption performance between the first passivation layer 111 and the second passivation layer 112. For example, the first intermediate layer may affect the reflection performance (such as reflectivity) of a short-wavelength-band incident light (such as ultraviolet light) in the overall passivation structure on the front surface. The material of the first intermediate layer may be a silicon oxide material, and a thickness of the first intermediate layer may be 0.5 nm~3 nm.

In some examples, a second intermediate layer may be provided between the second passivation layer 112 and the third passivation layer 113. The second intermediate layer may be used to affect the reflection performance of the overall passivation structure on the front surface. For example, the second intermediate layer may affect the reflection performance (e.g., reflectivity) of the short-wavelength-band incident light (e.g., ultraviolet light) in the overall passivation structure on the front surface. The material of the second intermediate layer may be a silicon carbon oxynitride material, and a thickness of the second intermediate layer may be less than 10 nm. Further, a passivation contact structure is provided on the rear surface 10b. The passivation contact structure at least includes the tunneling oxide layer 121 and the doped conductive layer 122 sequentially formed in a direction away from the substrate 10. Herein, the material of the tunneling oxide layer 121 is a dielectric material, such as a silicon oxide, which is used to achieve an interface passivation of the rear surface 10b. The material of the doped conductive layer 122 is used to achieve the field passivation, and the material of the doped conductive layer 122 may be doped silicon. The doped conductive layer 122 and the substrate 10 have a doping element of a same conductivity type. The doped silicon may be at least one of N-type doped polycrystalline silicon, N-type doped microcrystalline silicon and N-type doped amorphous silicon, and the doped conductive layer 122 includes N-type doped ions. Herein, in some examples, the doped conductive layer 122 is a doped polycrystalline silicon layer. In the direction perpendicular to the rear surface 10b, a thickness of the doped conductive layer 122 ranges from 80 nm to 160 nm, for example, 100 nm, 120 nm or 140 nm, and a refractive index of the doped conductive layer 122 ranges from 3.5 to 4.5, for example, 3.75, 4 or 4.25.

In some examples, a fourth passivation layer 123 is further provided on the doped conductive layer 122, and the fourth passivation layer 123 is used to enhance the reflection effect of the incident light on a back of the solar cell. Herein, the fourth passivation layer 123 may include a plurality of sub-layers, and the refractive indices of different sub-layers gradually decrease in a direction from the rear surface 10b toward the doped conductive layer 122, which is beneficial to enhance the reflection effect of the incident light on the back of the solar cell by the internal reflection. If a material of the fourth passivation layer 123 is silicon nitride, a silicon nitride sub-layer with a relatively high refractive index has more hydrogen ions, and the hydrogen ions may migrate to the rear surface 10b under a diffusion power formed by a concentration difference or a thermal power due to a heat treatment process, so as to passivate interface defects between the substrate 10 and the passivation contact structure, inhibit the carrier recombination and improve the photoelectric conversion efficiency of the solar cell.

The fourth passivation layer 123 may include a bottom passivation layer, an intermediate passivation layer and a top passivation layer sequentially formed, and the bottom passivation layer covers a surface of the doped conductive layer 122. A refractive index of the bottom passivation layer may be set to 2.12~2.2, such as 2.14, 2.16 or 2.18, and a thickness of the bottom passivation layer in the direction perpendicular to the rear surface 10b is 10~20 nm, such as 13 nm, 15 nm or 18 nm. A refractive index of the intermediate passivation layer may be set to 2.10~2.12, such as 2.13, 2.15 or 2.18, and a thickness of the intermediate passivation layer is 20~30 nm, such as 23 nm, 25 nm or 28 nm. A refractive index of the top passivation layer may be set to 2.09~2.10, and a thickness of the top passivation layer is 30~50 nm, such as 35 nm, 40 nm or 45 nm. In general, the fourth passivation layer 123 includes a second silicon nitride $Si_aN_b$ material, and a ratio of a/b is 3.5~6.8, for example, 4.2, 4.9, 5.6 or 6.3. An overall refractive index of the fourth passivation layer 123 may be set to 2.04~2.2, for example, 2.08, 2.12 or 2.16. The thickness of the fourth passivation layer 123 may be set to 60 nm~100 nm, for example, 70 nm, 80 nm or 90 nm in the direction perpendicular to the rear surface 10b.

In addition, the solar cell further includes at least one first electrode 114 and at least one second electrode 124. The at least one first electrode 114 is electrically connected with the emitter 102, and the least one second electrode 124 is electrically connected with the doped conductive layer 122 by penetrating through the fourth passivation layer 123. In some examples, the least one first electrode 114 and/or the least one second electrode 124 may be sintered and printed by a conductive paste (a silver paste, an aluminum paste or a silver-aluminum paste).

In the present disclosure, the solar cell is provided with the third passivation layer including the silicon oxynitride material on the side of the second passivation layer away from the substrate; thereby the solar cell can have relatively good absorption efficiency for the short-wave light. Moreover, the atomic ratio of the silicon oxynitride material is defined, which is beneficial to make the third passivation layer have relatively high refractive index, so that the external light can enter the substrate at a smaller incident angle. In addition, the atomic ratio of the first silicon nitride material of the second passivation layer is defined, so that the second passivation layer can have higher refractive index than the third passivation layer, which is beneficial to reduce the internal reflection and the emission of the light, and moreover, the second passivation layer can have relatively weak electropositivity, which is beneficial to avoid the effect of the second passivation layer on the field passivation effect of the first passivation layer and the photoelectric effect of the substrate.

Figure 4:
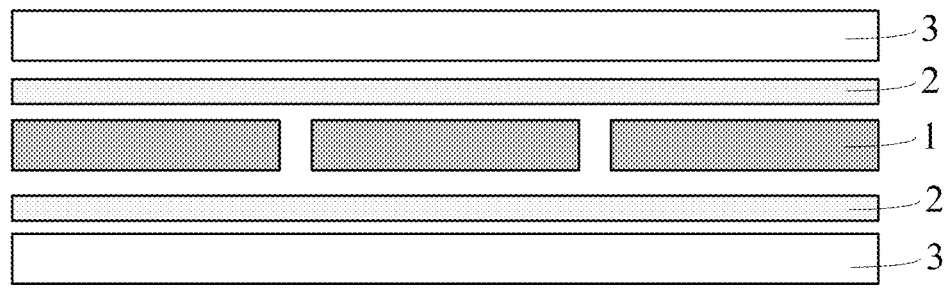
FIG. 4 and FIG. 5 show schematic structural diagrams of a solar cell module according to some embodiments of the present disclosure.

Some embodiments of the present disclosure further provide a solar cell module, which is used to convert received light energy into electric energy. As shown in FIG. 4, the solar cell module includes at least one solar cell string, a packaging film 2 and a cover plate 3. Each solar cell string is formed by connecting a plurality of solar cells 1. The solar cell 1 may be any of the aforementioned solar cells (including but not limited to the solar cell shown in FIG. 1). Adjacent solar cells 1 are electrically connected by a conductive strip. The adjacent solar cells 1 may be either partially stacked or spliced with each other. The packaging film 2 may be an organic packaging film such as an ethylene-vinyl acetate copolymer (EVA) film, a polyethylene octene co-elastomer (POE) film or a polyethylene terephthalate (PET) film. The packaging film 2 covers a surface of each of the at least one solar cell string for sealing. The cover plate 3 may be a transparent or translucent cover plate such as a glass cover plate or a plastic cover plate, and the cover plate 3 covers a surface of the packaging film 2 away from the at least one solar cell string. In some examples, a light trapping structure is provided for the cover plate 3 to increase utilization rate of incident light, and the cover plate may have different light trapping structures. The solar cell module has relatively high current collection ability and relatively low carrier recombination rate, which may realize the relatively high photoelectric conversion efficiency of the solar cell module. Moreover, a front of the solar cell module is dark blue or even black, which may be suitable for more scenarios.

In some examples, the packaging film 2 and the cover plate 3 are just formed on a front surface of the solar cell 1, because that the packaging film 2 and the cover plate 3 formed on a rear surface of the solar cell 1 may block and weaken relatively weak light. Further, the solar cell module may be packaged in a side edge fully enclosed manner, that is, the side edges of the solar cell module are completely covered by the packaging film 2, so as to prevent the solar cell module from lamination offset during lamination and avoid the external environment from affecting the performance of the solar cell through the side edges of the solar cell module, such as water vapor intrusion.

Figure 5:
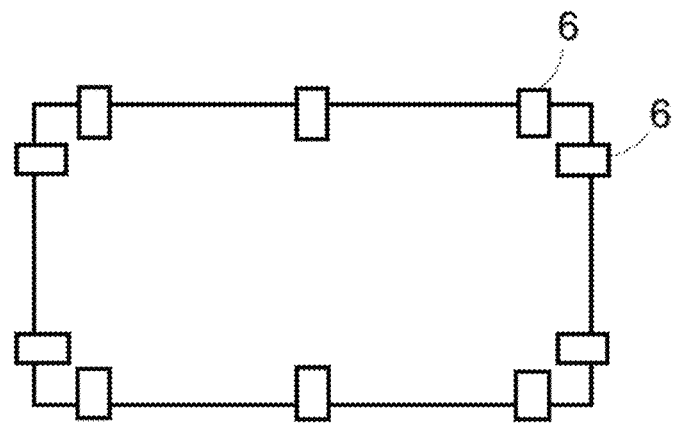

In some examples, as shown in FIG. 5, the solar cell module further includes an edge sealing member 6, which at least fixedly packages the side edges of the solar cell module. Further, the edge sealing member 6 at least fixedly packages a portion of the side edges close to corners of the solar cell module. The edge sealing member 6 may be a high-temperature resistant adhesive tape. Since the edge sealing member 6 has high-temperature resistant characteristic, the solar cells may not be damaged or fall off during the lamination and use, which is beneficial to ensuring reliable packaging of the solar cell module. In some examples, the high-temperature resistant adhesive tape is adhered not only to side surfaces of the solar cell module, but also to a front surface and rear surface of the solar cell module, so that it is beneficial to inhibit the lamination offset of the solar cell module during the lamination and stress deformation of the solar cell module under stress.

Figure 6:
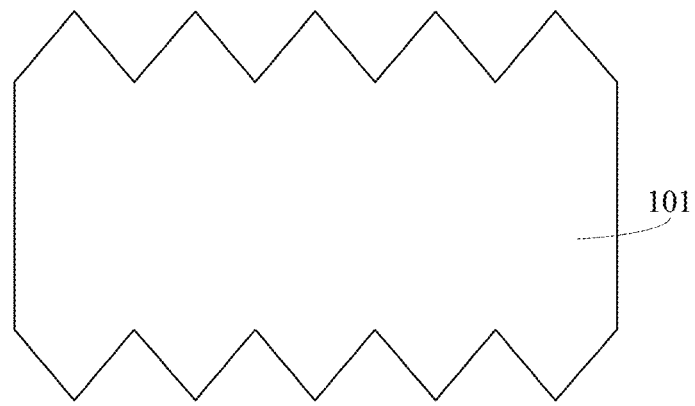
FIGS. 6 to 10 show schematic structural diagrams corresponding to each step of a method for producing a solar cell according to some embodiments of the present disclosure.

Some embodiments of the present disclosure further provide a method for producing a solar cell. FIGS. 6-10 and FIG. 1 shows schematic structural diagrams corresponding to each step of the method for producing the solar cell according to the embodiments of the present disclosure. As shown in FIG. 6, a base 101 is provided and is double-sided textured.

In some examples, the base 101 is cleaned, and a pyramid textured surface is prepared by a wet chemical etching process. The pyramid textured surface may reduce the light reflection at the surface of the base 101, thereby increasing the absorption and utilization rate of light by the base 101 and improving the conversion efficiency of the solar cell. In some examples, a material of the base 101 is monocrystalline silicon, a thickness of the base 101 is 60~240 μm, such as, 60 μm, 80 um, 90 μm, 100 um, 120 μm, 150 um, 200 μm or 240 um, etc., and a resistivity of the base 101 ranges from 0.3 to 2 ohm·cm. In addition, the base 101 may be an N-type semiconductor or a P-type semiconductor, and hereinafter, the base 101 is the N-type semiconductor is taken as an example.

For example, the texturing of the base 101 may be performed by but not limited to a wet texturing process. If the base 101 is the N-type monocrystalline silicon, alkaline solution such as potassium hydroxide solution may be used for texturing the base 101. NaOH solution has anisotropic corrosivity, and is beneficial to prepare pyramid-shaped microstructures. The pyramid-shaped microstructures may be tetrahedron shape, approximate tetrahedron shape, pentahedron shape, approximate pentahedron shape or other structures. In addition, the texturing process may also be a chemical etching process, a laser etching process, a mechanical process, or a plasma etching process, etc. The pyramid-shaped microstructures enable a screen printing metal paste to better fill the microstructures when forming electrodes, thus achieving a more excellent electrode contact, effectively reducing a series resistance of the solar cell and improving a filling factor. The overall refractive index of the solar cell may be less than 10% by controlling the morphology of the pyramid-shaped microstructures.

Figure 7:
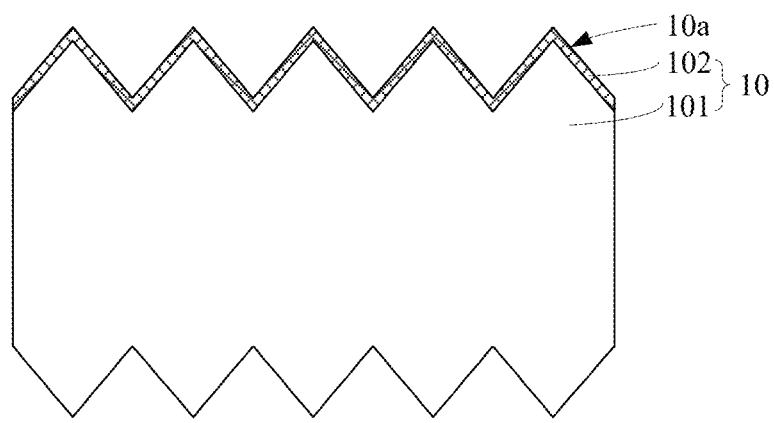

As shown in FIG. 7, a P-type emitter 102 is formed.

After the double-sided texturing of the base 101, a boron diffusion treatment is performed for a front surface 10a of the base 101 to form the P-type emitter 102. The P-type emitter 102 occupies a portion of a surface layer of a sun-facing side of the base 101. The P-type emitter 102 and the N-type base 101 constitute the substrate 10. Herein, a diffusion square resistance of the P-type emitter 102 ranges from 130 to 150Ω, and a surface diffusion concentration of the P-type emitter 102 ranges from E18 to E19.

It should be noted that the boron diffusion treatment may also generate unwanted borosilicate glass at the front surface (i.e., the front surface 10a), a rear surface and a side surface of the base 101. The borosilicate glass has a certain protective effect on the base 101, thus avoiding damage to the surface of the base 101 caused by some further processes. In other words, the unwanted borosilicate glass may be used as a mask layer for the base 101. Herein, a boron source used in the boron diffusion treatment includes liquid boron tribromide, and a microcrystalline silicon phase may convert into a polycrystalline silicon phase during the boron diffusion treatment.

Figure 8:
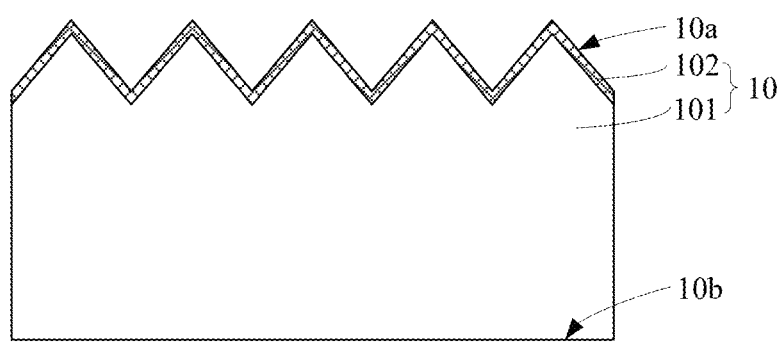

As shown in FIG. 8, a planarization process (e.g., alkali polishing) is performed on the rear surface of the base 101.

The rear surface is a surface of the solar cell facing away from sunlight, and the rear surface may turn to a flat surface (i.e., the rear surface 10b) by the planarization process. The flat surface is required for depositing a further film layer thereon. During the planarization process, the borosilicate glass at the rear surface is removed at the same time.

In some examples, before the polishing process, the following steps are further included: removing the borosilicate glass at the rear surface 10b of the base 101 with a prepared mixed acid. The mixed acid includes hydrofluoric acid solution with a mass fraction of 0.1%~10%, sulfuric acid solution with a mass fraction of 10%~20% and nitric acid solution with a mass fraction of 25%~50%. An acid washing time is 10 s~180 s, an acid washing temperature is 7° C.~20° C. The acid-washed rear surface 10b of the substrate 10 is further washed with water and is further performed with a drying treatment. It should be noted that the acid-washed rear surface 10b of the substrate 10a may be porous structure.

In some examples, the rear surface 10b of the substrate 10a may be polished with the alkaline solution. In an example, the rear surface 10b is firstly washed by alkaline solution with a mass fraction of 5%~15% to remove porous silicon. A micro-droplet of the alkaline solution is dropped onto the rear surface 10b by spraying for a roughening treatment, and the hydrofluoric acid with a mass fraction of 5%~10% is used for pre-cleaning. The rear surface 10b is further polished with a polishing liquid at a polishing temperature of 70° C.~80° C. with a polishing time less than 260 s; the polishing liquid includes NaOH with a mass fraction of 1%~15%, KOH with a mass fraction of 1%~15% and an additive with a mass fraction of 0.5%~2.5%. A mixed solution of potassium hydroxide with a mass fraction of 5%~15% and hydrogen peroxide with a mass fraction of 15%~40% is used to remove organic component in an etching liquid. The polished substrate 10 is washed with water and dried later.

In some examples, since the boron concentration of the rear surface 10b is relatively low, etching the rear surface 10b with the alkaline solution can effectively improve the etching efficiency. The alkaline solution includes an organic base and/or an inorganic base. The inorganic base may be NaOH, KOH, Ga(OH)$_2$, or NH$_3$·H$_2$O. The organic base may be triethylamine, nitrophenol, pyridine, quinine, or colchicine, etc. The additive in the polishing liquid may be a buffer solution composed of sodium sulfonate, maleic anhydride, alkyl glycoside, etc. In some examples, a polishing weight loss of the substrate 10 is less than 0.3 g. The rear surface 10b of the substrate 10 may have a desired structure by controlling the polishing time and polishing temperature during the polishing treatment.

In some examples, the structural morphology of the rear surface 10b is different from that of the front surface 10a, so as to enhance the absorption of light through the different morphologies of the surfaces. Exemplarily, the front surface 10a may have a pyramid-shaped structure, focusing on improving the anti-reflection ability. The rear surface 10b may have a stacked and stepped morphology to ensure that the tunneling oxide layer covering the rear surface 10b has relatively high density and uniformity, thus ensuring that the tunneling oxide layer has a good passivation effect on the rear surface 10b.

Figure 9:
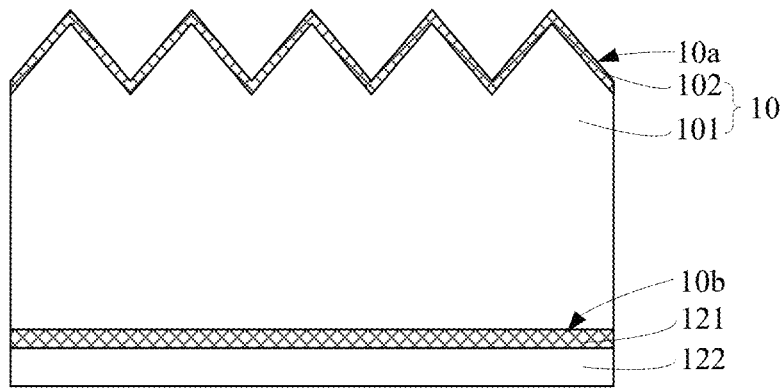

As shown in FIG. 9, a tunneling oxide layer 121 and a doped conductive layer 122 are formed.

In some examples, the tunneling oxide layer 121 is formed by a deposition process. In an example, the material of the tunneling oxide layer 121 includes silicon oxide, and the deposition process includes a chemical vapor deposition process. In a direction perpendicular to the rear surface 10b, the tunneling oxide layer 121 has a thickness of 1~2 nm, such as 1.2 nm, 1.4 nm, 1.6 nm or 1.8 nm. In other embodiments, the tunneling oxide layer may be formed by an in-situ generation process. In an example, the tunneling oxide layer may be formed in-situ by a thermal oxidation process and a nitric acid passivation process on a silicon substrate.

In some examples, the tunneling oxide layer 121 is deposited on the rear surface 10b by using a temperature-variable process and a chemical vapor deposition process. During the deposition, the heating rate is controlled to be 0.5° C./min~3° C./min, such as 1.0° C./min, 1.5° C./min, 2.0° C./min or 2.5° C./min, etc.; the deposition temperature is 560° C.~620° C., such as 570° C., 590° C. or 610° C., etc.; and the deposition time is 3 min~10 min, for example 4 min, 6 min or 8 min, etc.

In some examples, after forming the tunneling oxide layer 121, intrinsic polycrystalline silicon is deposited on the tunneling oxide layer 121 to form a polycrystalline silicon layer, and phosphorus ions are doped by an ion implantation and source diffusion process to form an N-type doped polycrystalline silicon layer, and the doped polycrystalline silicon layer serves as the doped conductive layer 122. In the direction perpendicular to the rear surface 10b, the thickness of the doped conductive layer 122 may be set to 80~160 nm, for example, 100 nm, 120 nm or 140 nm. In other embodiments, the doped conductive layer 122 and the substrate 10 has a doping element of a same conductivity type. If the substrate 10 is an N-type semiconductor, the doped conductive layer 122 is at least one of an N-type doped polycrystalline silicon layer, an N-type doped microcrystalline silicon layer and an N-type doped amorphous silicon layer.

During forming the tunneling oxide layer 121 and the doped conductive layer 122 by the deposition process, since the front surface has the borosilicate glass as a mask layer to protect the front surface 10a of the base 101, there is no need to limit the deposition area to the rear surface by a mask during the deposition process, and further the boric acid glass on the front surface as well as the silicon oxide and polycrystalline silicon deposited on the front surface can be removed at the same time by using a same process. In this way, no additional mask is required, which is conducive to reducing process steps, shortening process flow, and reducing process cost. In other examples, if the interface passivation layer is formed by the in-situ generation process, only polycrystalline silicon is deposited on the borosilicate glass on the front surface of the substrate.

In some examples, the deposition of the tunneling oxide layer 121 and the polycrystalline silicon layer as well as the doping of the polycrystalline silicon layer are performed in a low pressure chemical vapor deposition device. The specific steps include: first, placing the substrate 10 after the alkali polishing in the deposition device, introducing an oxygen source (for example, oxygen, nitrous oxide, ozone) of 20 L to 60 L, heating the temperature in the deposition device to 560° C.~620° C. at a heating rate of 0.5° C./min~3° C./min, and the deposition time being 3 min~10 min to form the tunneling oxide layer 121; entering a constant temperature stage after the oxygen introduction is finished, and then introducing a proper amount of silane to form the polycrystalline silicon layer; and finally, doping the polycrystalline silicon layer in situ to form the doped conductive layer 122.

Figure 10:
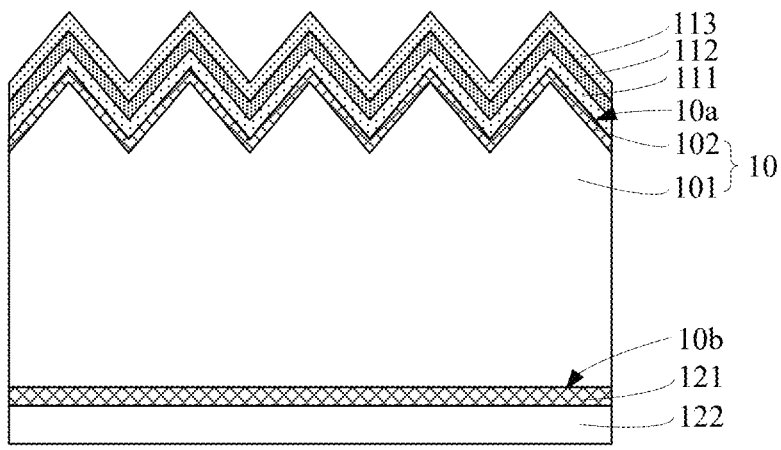

As shown in FIG. 10, a first passivation layer 111, a second passivation layer 112, and a third passivation layer 113 are formed on the front surface 10a.

In some examples, before forming the first passivation layer, it is required to remove the unwanted borosilicate glass, silicon oxide, and polycrystalline silicon plated on the front surface 10a of the substrate 10. In other embodiments, before forming the first passivation layer, it is required to remove the unwanted borosilicate glass and polycrystalline silicon plated on the front surface 10a of the substrate 10.

Further, in some examples, after removing the unwanted material, a thin silicon oxide layer is grown on the front surface of the substrate. The formation process for the thin silicon oxide layer includes a natural oxidation process, a thermal oxidation process, a wet oxidation process, an atomic layer deposition process, or a plasma enhanced chemical vapor deposition process, etc. The thin silicon oxide layer has a thickness of 0~3 nm in the direction perpendicular to the substrate surface, such as 1 nm, 1.5 nm or 2 nm.

In some examples, the first passivation layer 111, the second passivation layer 112, and the third passivation layer 113 may be formed by, but not limited to such as a chemical vapor deposition process, a low pressure chemical vapor deposition process, a plasma-enhanced chemical vapor deposition process (e.g., a direct plasma deposition process or an indirect plasma deposition process), and a magnetron sputtering process. Herein, the first passivation layer 111 includes a dielectric material; the second passivation layer 112 includes a first silicon nitride $Si_mN_n$ material, and a ratio of n/m is 0.5~1; and the third passivation layer 113 includes a silicon oxynitride $SiO_iN_j$ material, and a ratio of j/i is 0.1~0.6. Hereinafter, an atomic layer deposition process combined with a tubular plasma-enhanced chemical vapor deposition process is taken as an example of the preparation process for description.

The material of the first passivation layer 111 may be an interface passivation material or a field passivation material depending on whether the main passivation effect to be achieved is a field passivation or an interface passivation. The interface passivation material includes at least one of silicon oxide and silicon oxynitride, and the field passivation material includes at least one of aluminum oxide, titanium oxide, gallium oxide and hafnium oxide. Hereinafter, as an example, the material of the first passivation layer 111 is mainly the field passivation material, such as an aluminum oxide $Al_xO_y$ material.

In some examples, the first passivation layer 111 is formed by the atomic layer deposition process. During the process, reactants include trimethyl aluminum and water, and the deposition temperature is 150~250° C., such as 175° C., 200° C. or 225° C. A refractive index of the first passivation layer 111 at a wavelength of 632 nm is 1.6~1.7, such as 1.63, 1.65 or 1.67. The first passivation layer 111 has a thickness of 3 nm~10 nm, such as 5 nm, 7 nm or 9 nm, in the direction perpendicular to the front surface 10a.

After forming the first passivation layer 111, the first passivation layer 111 is placed in a protective gas atmosphere for a high-temperature annealing treatment to remove residual water molecules and organic functional groups. During the high-temperature annealing treatment, an annealing temperature is 450° C.~550° C., such as 475° C., 500° C. or 525° C., and an annealing time is longer than 10 min, such as 12 min, 14 min or 16 min. It should be noted that the "protective gas" may be any gas that does not participate in the reaction, such as inert gas. In some examples, nitrogen gas may be used as the protective gas.

In some examples, the second passivation layer 112 is formed by the plasma-enhanced chemical vapor deposition process. During the deposition process, reactants are silane and ammonia gas. A flow ratio of the silane to the ammonia gas is ¼~¹⁄₁₅, such as ⅙, ⅑ or ¹⁄₁₂, and a pulse power per unit area is 30~40 mW/cm², such as 33 mW/cm², 35 mW/cm² or 37 mW/cm². The atomic ratio of the first silicon nitride $Si_mN_n$ material of the second passivation layer 112 may be set to a preset range, by controlling the flow ratio and the pulse power per unit area in the deposition process, so that the second passivation layer 112 may have a desired refractive index. Exemplarily, an overall refractive index of the second passivation layer 112 including the first silicon nitride $Si_mN_n$ material at a wavelength of 632 nm is 1.9~2.2, such as 2.0, 2.05 or 2.1. In addition, the second passivation layer 112 has a thickness of 40 nm~60 nm, such as 45 nm, 50 nm or 55 nm, in the direction perpendicular to the front surface 10a.

In some examples, the third passivation layer 113 is formed by using the plasma-enhanced chemical vapor deposition process. During the deposition process, reactants are silane, nitrous oxide and ammonia gas. A flow ratio of the silane to the nitrous oxide is not less than ¹⁄₁₀, for example, ¼, ⅙ or ⅛, and a pulse power per unit area is 25~40 mW/cm², for example, 28 mW/cm², 30 mW/cm² 33 mW/cm², or 36 mW/cm². The atomic ratio of the silicon oxynitride $SiO_iN_j$ material of the third passivation layer 113 may be set to a preset range by controlling the flow ratio and the pulse power per unit area in the deposition process, so that the third passivation layer 113 may have a desired refractive index. Exemplarily, an overall refractive index of the third passivation layer 113 at a wavelength of 632 nm is 1.45~1.8, such as 1.5, 1.6 or 1.7. In addition, the third passivation layer 113 has a thickness of 20~50 nm, such as 25 nm, 30 nm, 35 nm, 40 nm or 45 nm, in the direction perpendicular to the front surface 10a.

As shown in FIG. 1, a fourth passivation layer 123 is formed on the doped conductive layer 122, as well as at least one first electrode 114 and at least one second electrode 124 are formed.

In a case that the fourth passivation layer 123 is a silicon nitride layer, the silicon nitride layer may include 2~4 multi-layers with gradient refractive indices according to actual requirements. That is, the refractive indices of different silicon nitride sub-layers gradually decrease in a direction away from the substrate 10. In addition, reactants for forming the silicon nitride layer may be the silane and the ammonia gas, and a ratio of the number of silicon atoms to the number of nitrogen atoms in the fourth passivation layer 123 may be 3.5~6.8, such as 4.2, 4.9, 5.7 or 6.3. A refractive index range may be 2.04~2.2, such as 2.08, 2.12 or 2.16, and a thickness range may be 60~100 nm, such as 70 nm, 80 nm, or 90 nm.

After forming the fourth passivation layer 123, the at least one first electrode 114 and the at least one second electrode 124 may be formed by such as a metallization process, a screen printing process, and a high-temperature sintering process. In addition, after the electrodes are formed, a light-annealing treatment is further required to be performed, that is, the solar cell is heated under a temperature of 400 to 700° C. (e.g., 500° C. or 600° C.) for 1 min~6 min (e.g., 2 min, 3 min, 4 min or 5 min), and then treated for 1 min~6 min under a temperature of 150° C.~400° C. (e.g., 200° C., 250° C., 300° C.) and 1~6 times (e.g., 2, 3, 4, or 5 times) of sunlight intensity.

Those skilled in the art shall appreciate that the aforementioned embodiments are specific embodiments for implementing the present disclosure. In practice, however, various changes may be made in the forms and details of the specific embodiments without departing from the scope of the present disclosure. Any person skilled in the art may make their own changes and modifications without departing from the scope of the present disclosure, so the protection scope of the present disclosure shall be subject to the scope defined by the claims.

What is claimed is:

1. A solar cell, comprising:
   a substrate having a front surface and a rear surface opposite to the front surface;
   a first passivation layer, a second passivation layer and a third passivation layer formed on the front surface, wherein each of the second passivation layer and the third passivation layer has a respective multi-layer structure that includes a respective set of sublayers; and
   a tunneling oxide layer formed on the rear surface and a doped conductive layer formed on the tunneling oxide layer, wherein the rear surface is a non-pyramid textured surface having a stepped morphology;
   wherein the front surface is a pyramid textured surface, the first passivation layer includes a dielectric material, the second passivation layer is formed between the first passivation layer and the third passivation layer and each sublayer of the set of sublayers in the second passivation layer includes a first silicon nitride $Si_mN_n$ material, and an atomic ratio of a number of nitrogen atoms to a number of silicon atoms in the first silicon nitride $Si_mN_n$ material n/m ranges from 0.5 to 1; and
   wherein the dielectric material is an aluminum oxide $Al_xO_y$ material, and an atomic ratio of a number of oxygen atoms to a number of aluminum atoms in the aluminum oxide $Al_xO_y$ material y/x ranges from 1.1 to 1.5.

2. The solar cell according to claim 1, wherein refractive indices of the set of sub-layers in the multi-layer structure of the second passivation layer gradually decrease in a direction away from the front surface of the substrate, and refractive indices of the set of sub-layers in the multi-layer structure of the third passivation layer gradually decrease in the direction away from the front surface of the substrate.

3. The solar cell according to claim 1, wherein a first refractive index of the first passivation layer is greater than a third refractive index of the third passivation layer, and the third refractive index is an average refractive index of a plurality of sub-layers of the third passivation layer.

4. The solar cell according to claim 1, further including a first intermediate layer formed between the first passivation layer and the second passivation layer, wherein a material of the first intermediate layer is a silicon oxide material, and a thickness of the first intermediate layer ranges from 0.5 nm to 3 nm.

5. The solar cell according to claim 1, further including a second intermediate layer formed between the second passivation layer and the third passivation layer, wherein a material of the second intermediate layer is a silicon carbon oxynitride material, and a thickness of the second intermediate layer is less than 10 nm.

6. The solar cell according to claim 1, further including a fourth passivation layer formed on a side of the doped conductive layer facing away from the substrate, wherein the fourth passivation layer includes a bottom passivation layer, an intermediate passivation layer and a top passivation layer;
wherein the bottom passivation layer covers a surface of the doped conductive layer, and in a direction perpendicular to the rear surface:
a thickness of the bottom passivation layer ranges from 10 to 20 nm;
a thickness of the intermediate passivation layer ranges from 20 to 30 nm; and
a thickness of the top passivation layer ranges from 30 to 50 nm.

7. The solar cell according to claim 6, wherein a refractive index of the bottom passivation layer ranges from 2.12 to 2.2, a refractive index of the intermediate passivation layer ranges from 2.10 to 2.12, and a refractive index of the top passivation layer ranges from 2.09 to 2.10.

8. The solar cell according to claim 1, wherein the ratio of n/m for the first silicon nitride $Si_mN_n$ material ranges from 0.56 to 0.7.

9. The solar cell according to claim 1, wherein each sublayer of the set of sublayers in the third passivation layer includes a silicon oxynitride $SiO_iN_j$ material, an atomic ratio of a number of nitrogen atoms to a number of oxygen atoms in the silicon oxynitride $SiO_iN_j$ material j/i ranges from 0.1 to 0.6.

10. The solar cell according to claim 9, wherein a proportion of silicon atoms in the silicon oxynitride $SiO_iN_j$ material is greater than both a proportion of nitrogen atoms and a proportion of oxygen atoms in the silicon oxynitride $SiO_iN_j$ material.

11. The solar cell according to claim 1, wherein the substrate is an N-type semiconductor substrate and includes a base and an emitter;
wherein the base includes an N-type doping element, and the emitter includes a P-type doping element; and
wherein the first passivation layer covers the emitter.

12. The solar cell according to claim 1, wherein the first passivation layer further includes a silicon oxide material covering the front surface being pyramid textured surface, and the silicon oxide material is embedded between the substrate and the dielectric material;
wherein in a direction perpendicular to the front surface, a thickness of a film layer including the silicon oxide material ranges from 0.5 to 2 nm.

13. The solar cell according to claim 1, wherein a material of the tunneling oxide layer is a dielectric material including silicon oxide, the doped conductive layer is a doped polycrystalline silicon layer, a refractive index of the doped conductive layer ranges from 3.5 to 4.5, and in a direction perpendicular to the rear surface, a thickness of the doped conductive layer ranges from 80 nm to 160 nm.

14. A solar cell module, comprising:
at least one solar cell string each formed by connecting a plurality of the solar cells;
at least one packaging film configured to cover a surface of each of the at least one solar cell string; and
at least one cover plate configured to cover a surface of each of the at least one packaging film away from the at least one solar cell string;
wherein each solar cell of the plurality of the solar cells comprises:
a substrate having a front surface and a rear surface opposite to the front surface;
a first passivation layer, a second passivation layer and a third passivation layer formed on the front surface, wherein each of the second passivation layer and the third passivation layer has a respective multi-layer structure that includes a respective set of sublayers; and
a tunneling oxide layer formed on the rear surface and a doped conductive layer formed on the tunneling oxide layer, wherein the rear surface is a non-pyramid textured surface having a stepped morphology;
wherein the front surface is a pyramid textured surface, the first passivation layer includes a dielectric material, the second passivation layer is formed between the first passivation layer and the third passivation layer and each sublayer of the set of sublayers in the second passivation layer includes a first silicon nitride $Si_mN_n$ material, and an atomic ratio of a number of nitrogen atoms to a number of silicon atoms in the first silicon nitride $Si_mN_n$ material n/m ranges from 0.5 to 1; and
wherein the dielectric material is an aluminum oxide $Al_xO_y$ material, and an atomic ratio of a number of oxygen atoms to a number of aluminum atoms in the aluminum oxide $Al_xO_y$ material y/x ranges from 1.1 to 1.5.

15. The solar cell module according to claim 14, wherein refractive indices of the set of sub-layers in the multi-layer structure of the second passivation layer gradually decrease in a direction away from the front surface of the substrate, and refractive indices of the set of sub-layers in the multi-layer structure of the third passivation layer gradually decrease in the direction away from the front surface of the substrate.

16. The solar cell module according to claim 14, further including a first intermediate layer formed between the first passivation layer and the second passivation layer, wherein a material of the first intermediate layer is a silicon oxide material, and a thickness of the first intermediate layer ranges from 0.5 nm to 3 nm.

17. The solar cell module according to claim 14, further including a second intermediate layer formed between the second passivation layer and the third passivation layer, wherein a material of the second intermediate layer is a silicon carbon oxynitride material, and a thickness of the second intermediate layer is less than 10 nm.

* * * * *